United States Patent
Ohmori et al.

(10) Patent No.: US 8,546,897 B2
(45) Date of Patent: Oct. 1, 2013

(54) MAGNETIC MEMORY ELEMENT

(75) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 241 days.

(21) Appl. No.: 13/193,935

(22) Filed: Jul. 29, 2011

(65) Prior Publication Data

US 2012/0043631 A1    Feb. 23, 2012

(30) Foreign Application Priority Data

Aug. 19, 2010  (JP) ................ 2010-183631

(51) Int. Cl.
*H01L 29/82* (2006.01)
*G11C 11/02* (2006.01)

(52) U.S. Cl.
USPC ............ 257/421; 257/427; 438/3; 360/324.2; 360/326; 365/157; 365/158; 365/171; 365/172; 365/173

(58) Field of Classification Search
USPC .............. 257/421–427, E29.323; 438/3; 360/324–326; 365/157–158, 171–173
See application file for complete search history.

(56) References Cited

U.S. PATENT DOCUMENTS 7,126,848 B2    10/2006 Nakamura et al.
2009/0080124 A1 *  3/2009 Yoshikawa et al. ...... 360/324.12

FOREIGN PATENT DOCUMENTS

JP    2004193595    7/2004
JP    2009-81215    4/2009

* cited by examiner

*Primary Examiner* — Jami M Valentine
(74) *Attorney, Agent, or Firm* — K&L Gates LLP

(57) ABSTRACT

A magnetic memory element includes a memory layer, a reference layer, and a spin-injection layer provided between the memory layer and the reference layer. The reference layer has a structure in which at least two CoPt layers containing 20 atomic % or more and 50 atomic % or less of Pt and having a thickness of 1 nm or more and 5 nm or less are stacked with a Ru layer provided therebetween. The thickness of the Ru layer is 0.45±0.05 nm or 0.9±0.1 nm. In addition, the axis of 3-fold crystal symmetry of the CoPt layers is oriented perpendicularly to the film surface. The reference layer includes a high spin polarization layer of 1.5 nm or less containing Co or Fe as a main component at an interface with the spin-injection layer.

7 Claims, 13 Drawing Sheets

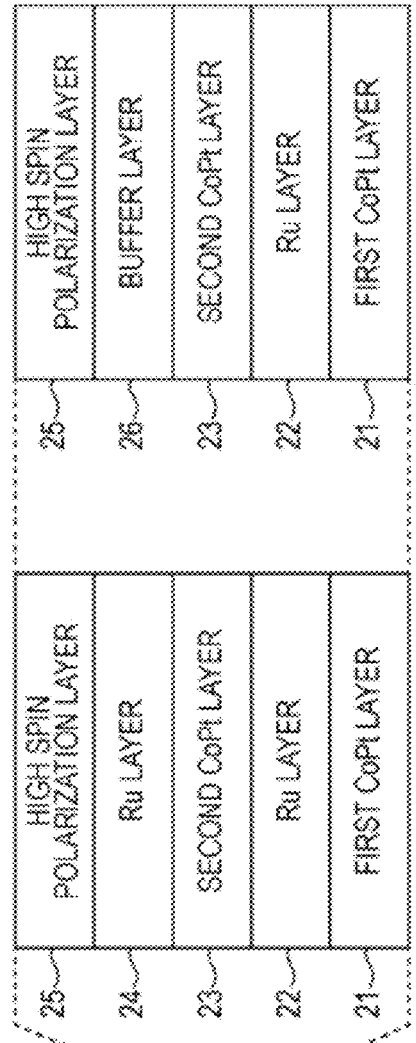
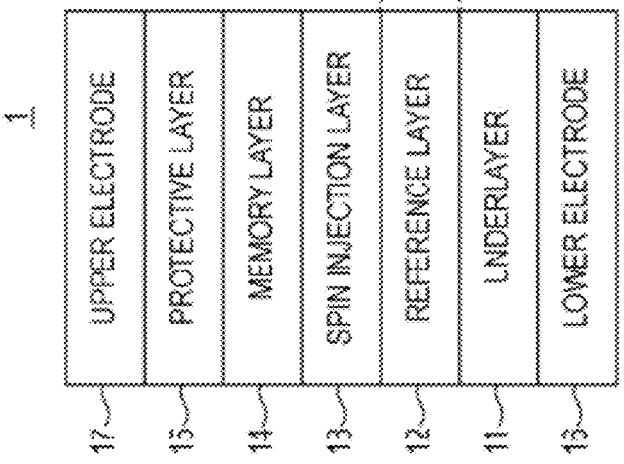

| 17 | UPPER ELECTRODE |
| 15 | PROTECTIVE LAYER |
| 14 | MEMORY LAYER |
| 13 | SPIN INJECTION LAYER |
| 12 | REFERENCE LAYER |
| 11 | UNDERLAYER |
| 19 | LOWER ELECTRODE |

FIG. 3B

| 25 | HIGH SPIN POLARIZATION LAYER |
| 28 | Ru LAYER |
| 27 | THIRD CoPt LAYER |
| 24 | Ru LAYER |
| 23 | SECOND CoPt LAYER |
| 22 | Ru LAYER |
| 21 | FIRST CoPt LAYER |

FIG. 3C

| 25 | HIGH SPIN POLARIZATION LAYER |
| 26 | BUFFER LAYER |
| 27 | THIRD CoPt LAYER |
| 24 | Ru LAYER |
| 23 | SECOND CoPt LAYER |
| 22 | Ru LAYER |
| 21 | FIRST CoPt LAYER |

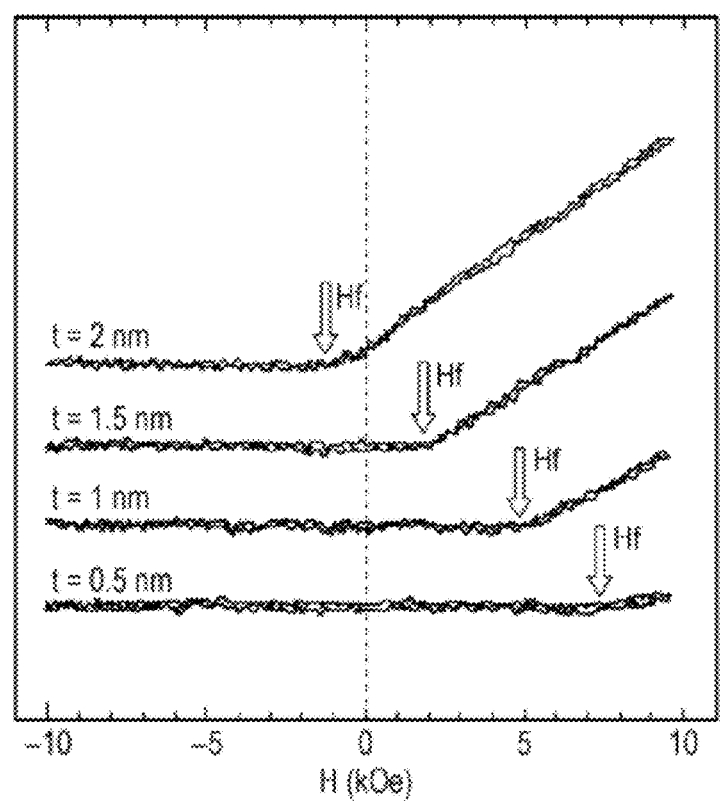

FIG. 12

| BUFFER LAYER | MR RATIO (%) |
|---|---|
| NO | 20 |
| Ta (0.1 nm) | 35 |
| Ta (0.2 nm) | 85 |
| Ta (0.3 nm) | 42 |
| Ta (0.4 nm) | 12 |
| Ru (0.2 nm) | 63 |
| Re (0.2 nm) | 77 |
| Ti (0.2 nm) | 79 |
| Cr (0.2 nm) | 94 |
| Mg (0.3 nm) | 68 |
| Gd (0.3 nm) | 104 |

| BUFFER LAYER | MR RATIO (%) |
|---|---|
| Tb (0.3 nm) | 103 |
| Dy (0.3 nm) | 96 |
| Ho (0.3 nm) | 87 |
| Nb (0.2 nm) | 77 |
| Zr (0.2 nm) | 87 |
| Hf (0.2 nm) | 90 |
| Zn (0.3 nm) | 101 |
| Si (0.2 nm) | 80 |
| Ge (0.2 nm) | 91 |
| V (0.3 nm) | 44 |
| Mo (0.2 nm) | 74 |

| BUFFER LAYER | MR RATIO (%) |
|---|---|
| W (0.2 nm) | 76 |
| MgO (0.1 nm) | 96 |
| Al₂O₃ (0.2 nm) | 82 |
| TiO₂ (0.3 nm) | 100 |
| SiO₂ (0.2 nm) | 98 |
| Au (0.2 nm) | 8 |
| Cu (0.2 nm) | 10 |
| Al (0.2 nm) | 20 |
| Pt (0.3 nm) | 4 |
| Pd (0.3 nm) | 5 |
| Ag (0.3 nm) | 10 |

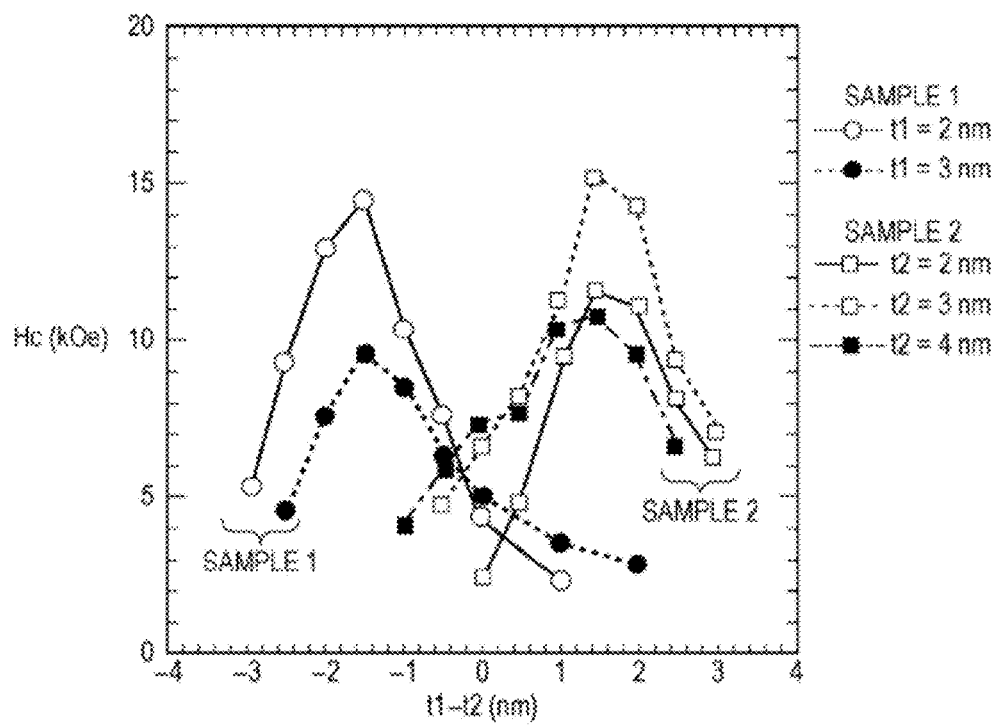

MAGNETIC MEMORY ELEMENT

CROSS REFERENCES TO RELATED APPLICATIONS

The present application claims priority to Japanese Priority Patent Application JP 2010-183631 filed in the Japan Patent Office on Aug. 19, 2010, the entire contents of which are hereby incorporated by reference.

BACKGROUND

The present application relates to a magnetic memory element having a layer structure including a plurality of perpendicular magnetization films which serve as a memory layer and a reference layer and which are stacked with a nonmagnetic material therebetween, and particularly to a structure of the reference layer.

In information devices such as computers, DRAMs (Dynamic Random Access Memories) with a high operation speed and a high density are widely used as RAMs (Radom Access Memories). However, DRAMs are volatile memories which lose information when power supplies are turned off, and thus nonvolatile memories which retain information are desired.

MRAMs (Magnetic Random Access Memories) which store information by magnetization of magnetic materials attract attention as a candidate of nonvolatile memories and are being developed.

Storage methods for MRAMs include a method of reversing magnetization by a current magnetic field, and a method of inducing magnetization reversal by injecting spin-polarized electrons directly into a memory layer as disclosed in, for example, Japanese Unexamined Patent Application Publication No. 2004-193595. In particular, spin-injection magnetization reversal capable of decreasing a storage current with decrease in size of an element attracts attention.

Further, there is investigated a method using a perpendicular magnetization film composed of a magnetic material having a perpendicular magnetization direction in order to miniaturize an element as disclosed in, for example, Japanese Unexamined Patent Application Publication No. 2009-81215.

A magnetic memory element has a layer structure including a memory layer and a reference layer serving as magnetic layers which are stacked with a nonmagnetic material therebetween.

As perpendicular magnetization films of a magnetic memory element having perpendicular magnetization, materials proposed for both the reference layer and the recording layer substantially are substantially the same and include TbFeCo, FePt, CoPt, Co/Pt continuous stacked films, and Co/Pd continuous stacked films.

SUMMARY

However, the characteristics desired for the reference layer are significantly different from those for the recording layer, and thus it is difficult to satisfy the characteristics of the reference layer by using existing materials.

The characteristics desired for the reference layer include perpendicular magnetization which is stable in a micro element against heat, an external magnetic field, or a recording current. Further, in order to perform fine processing, it is necessary to realize high coercive force with as a thin film as possible, and a desired coercive force is at least 5 kOe or more.

It is desirable to realize a magnetization reference layer which has resistance to a manufacturing process, a small thickness, high coercive force, and high heat-resistance in a magnetic memory element having perpendicular magnetization.

A magnetic memory element according to an embodiment of the present disclosure includes a memory layer having magnetization perpendicular to a film surface and being changed in magnetization direction in response to information, a reference layer having magnetization perpendicular to the film surface and serving as a reference for information, and a spin-injection layer composed of a nonmagnetic material and provided between the memory layer and the reference layer. When a current is passed through a layer structure including the memory layer, the spin-injection layer, and the reference layer, spin torque is produced so that data is stored by magnetization reversal induced by the spin torque in the memory layer. The reference layer has a structure in which at least two CoPt layers containing 20 atomic % or more and 50 atomic % or less of Pt and having a thickness of 1 nm or more and 5 nm or less are stacked with a Ru layer provided therebetween. The thickness of the Ru layer is 0.45±0.05 nm or 0.9±0.1 nm. In addition, the axis of 3-fold crystal symmetry of the CoPt layers is oriented perpendicularly to the film surface. Further, an interface between the reference layer and the spin-injection layer includes a high spin polarization layer of 1.5 nm or less containing Co or Fe as a main component.

The high spin polarization layer in the reference layer is a CoFeB layer.

The CoPt layer in the reference layer may be substituted by Ni for less than 50% of Pt.

The reference layer is configured by sequentially stacking a first CoPt layer, a Ru layer, a second CoPt layer, a Ru layer, and a high spin polarization layer. In this case, the thickness of the second CoPt layer is larger than the thickness of the first CoPt layer by 1 nm or more and 2 nm or less.

The reference layer is configured by sequentially stacking a first CoPt layer, a Ru layer, a second CoPt layer, a buffer layer, and a high spin polarization layer. In this case, the buffer layer has a thickness of 0.3 nm or less and is composed of at least one of Ti, Cr, V, Nb, Ta, Mo, W, Zr, Hf, Si, Ge, Zn, Mg, Gd, Tb, Dy, Ho, Re, Ru, MgO, $Al_2O_3$, $TiO_2$, and $SiO_2$. In addition, the thickness of the first CoPt layer is larger by 1 nm or more and 2 nm or less than the thickness of the second CoPt layer.

The reference layer is configured by sequentially stacking a first CoPt layer, a Ru layer, a second CoPt layer, a Ru layer, a third CoPt layer, a Ru layer, and a high spin polarization layer. In this case, the total thickness of the first CoPt layer and the third CoPt layer is larger than the thickness of the second CoPt layer by 1 nm or more and 2 nm or less.

The reference layer is configured by sequentially stacking a first CoPt layer, a Ru layer, a second CoPt layer, a Ru layer, a third CoPt layer, a buffer layer, and a high spin polarization layer. In this case, the buffer layer has a thickness of 0.3 nm or less and is composed of at least one of Ti, Cr, V, Nb, Ta, Mo, W, Zr, Hf, Si, Ge, Zn, Mg, Gd, Tb, Dy, Ho, Re, Ru, MgO, $Al_2O_3$, $TiO_2$, and $SiO_2$. In addition, the thickness of the second CoPt layer is larger by 1 nm or more and 2 nm or less than the total thickness of the first CoPt layer and the third CoPt layer.

In the magnetic memory element including the reference layer and the memory layer which have perpendicular magnetization and which are stacked with the nonmagnetic layer (spin injection layer) provided therebetween, the reference layer is composed of a CoPt alloy having thermally-stable hexagonal crystal or a mixture of the hexagonal crystal and face-centered cubic crystal and having a Pt content of 20 atomic % or more and 50 atomic % or less, and the axis of 3-fold symmetry is oriented perpendicularly to the film surface. In this case, stable perpendicular magnetic anisotropy may be achieved.

However, the coercive force of the reference layer is not sufficiently obtained only by this configuration. Therefore, the coercive force is increased by antiferromagnetic coupling through a Ru layer provided between at least two CoPt layers. In particular, when the CoPt alloy layer has a thickness of 1 nm or more and 5 nm or less, and the Ru layer has a thickness of 0.45±0.05 nm or 0.9±0.1 nm, it is possible to achieve characteristics stable until a high process temperature while maintaining the excellent coercive force increasing effect.

According to an embodiment of the present application, a reference layer having a small thickness, high coercive force, and high heat resistance can be realized, and a magnetic memory little susceptible to the influences of a temperature and an external magnetic field and capable of stable operation can be realized.

Additional features and advantages are described herein, and will be apparent from the following Detailed Description and the figures.

BRIEF DESCRIPTION OF THE FIGURES

FIGS. 2A, 2B, and 2C are explanatory drawings of configuration examples of a magnetic memory element according to an embodiment;

FIGS. 3A, 3B, and 3C are explanatory drawings of configuration examples of a magnetic memory element according to an embodiment;

FIGS. 11A and 11B are diagrams showing the results of measurement by the magneto-optical Kerr effect with changes in thickness of a CoFeB film in CoPt/Ru/CoPt/Ru/CoFeB films;

FIG. 12 is an explanatory drawing of magnetoresistance ratios of various buffer layers inserted between CoPt and CoFeB at a ferromagnetic tunnel junction of perpendicular magnetization films;

FIGS. 13A, 13B, and 13C are diagrams showing changes in coercive force with the difference in thickness between a first CoPt layer and a second CoPt layer of each of Samples 1 and 2 according to an embodiment.

DETAILED DESCRIPTION

Figure 1:
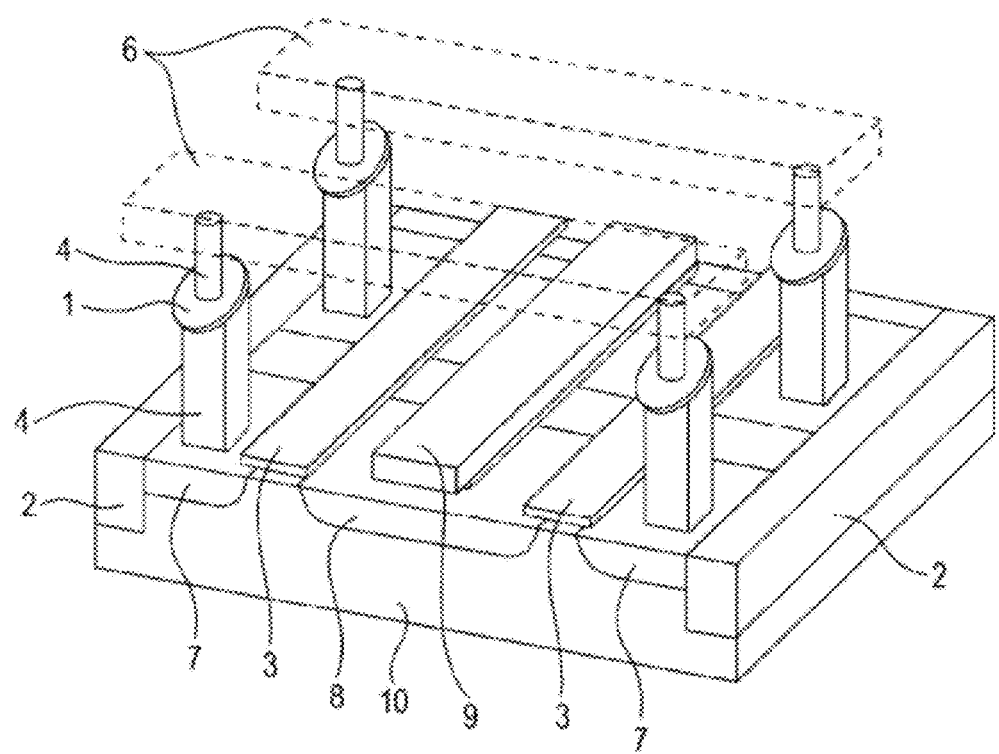
FIG. 1 is an explanatory drawing of a magnetic memory using a magnetic memory element according to an embodiment.

Embodiments of the present application will be described below in detail with reference to the drawings.
1. Outlines of structure of magnetic memory
2. Structural examples of magnetic memory element according to embodiment
3. Results of various investigations
3-1: Pt composition of CoPt layer
3-2: Effect of Ni addition to CoPt alloy
3-3: Structure including at least two CoPt layers stacked through Ru layer
3-4: Thickness of Ru layer
3-5: Thickness of CoPt layer
3-6: Thickness of high spin polarization layer
3-7: Buffer layer
3-8: Thickness ratio of various CoPt layers
3-9: Summary 1. Outlines of Structure of Magnetic Memory First, a structure of a magnetic memory using a magnetic memory element according to an embodiment is described. FIG. 1 schematically shows the outlines of a structure of a magnetic memory.

A magnetic memory 10 includes two types of address wiring, for example, a word line and a bit line, which intersect each other, and a magnetic memory element 1 disposed between the two types of wiring near each of the intersection points. The magnetic memory element 1 has a structure according to an embodiment described below.

In the magnetic memory 10, a drain region 8, a source region 3, an a gate electrode 3 which constitute a selection transistor for selecting each of the memory elements 1 are formed in a region separated by element separation layers 2 of a semiconductor substrate composed of Si or the like.

The gate electrode 3 also serves as one of the address wirings (for example, the word line) extending in the longitudinal direction of the drawing.

The drain region 8 is formed in common with the adjacent selection transistors in the transverse direction of the drawing, and a wiring 9 is connected to the drain region 8.

Each of the magnetic memory elements 1 is disposed between the source region 7 and the other address wiring (e.g., the bit line) 6 provided on the magnetic memory elements 1 and extending in the transverse direction of the drawing.

Each of the magnetic memory elements 1 includes a memory layer including a ferromagnetic layer which has perpendicular magnetization with the magnetization direction being reversed by spin injection, a reference layer having a magnetization direction serving as a reference for information stored in the memory layer, and a spin injection layer provided between the memory layer and the reference layer and including a nonmagnetic material.

The magnetic memory elements 1 are disposed near the intersection points between the gate electrodes 3 and the wirings 6 serving as the two types of wiring and are connected to the two types of wiring through upper and lower contact layers 4. As a result, the magnetization direction of the memory layer of each of the magnetic memory elements 1 can be reversed in accordance with information by spin injection caused by passing a current in the perpendicular diction through the gate electrode 3 and the wiring 6.

The structure shown in FIG. 1 is only an example for explaining the magnetic memory. For example, the wiring 6 may be formed on the magnetic memory elements 1 without the upper contact layers 4.

2. Structural Examples of Magnetic Memory Element According to Embodiment

As described above, in an embodiment, a magnetization reference layer which has resistance to the manufacturing process, a small thickness, high coercive force, and high heat resistance is realized, thereby realizing a magnetic memory element using a perpendicular magnetization film and being capable of stable operation as a magnetic memory element.

As a result of repeated investigations, the inventors found the following matters in a magnetic memory element including a reference layer and a memory layer which have perpendicular magnetization and which are stacked through a nonmagnetic layer (spin injection layer).

When a reference layer is composed of a CoPt alloy including a hexagonal crystal with thermal stability or a mixture of the hexagonal crystal and a face-centered cubic crystal, and having a Pt content of 20 atomic % or more and 50 atomic % or less, and the axis of 3-fold symmetry is oriented perpendicularly to the film surface, stable perpendicular magnetic anisotropy can be achieved.

However, the coercive force of the reference layer is not sufficiently obtained only by this configuration. Therefore, investigation was carried out for increasing the coercive force by antiferromagnetic coupling between at least two CoPt alloy layers with a Ru layer provided therebetween. As a result, it was found that in particular, when the CoPt alloy layer has a thickness of 1 nm or more and 5 nm or less, and the Ru layer has a thickness of 0.45±0.05 nm or 0.9±0.1 nm, characteristics stable until a high process temperature can be achieved, while the excellent coercive force increasing effect is maintained.

FIGS. 2A to 2C and 3A to 3C show examples of a basic configuration of the magnetic memory element 1 according to an embodiment. In particular, Configuration Examples I, II, III, and IV are given as the configuration of the reference layer.

FIG. 2A shows an example of a layer structure of the magnetic memory element 1. The magnetic memory element 1 is frequently formed in, for example, a cylindrical shape, an elliptic cylindrical shape, or a truncated cone shape. This figure shows a layer structure including many layers sequentially stacked in the cylindrical magnetic memory element 1.

As shown in FIG. 2A, the magnetic memory element 1 having perpendicular magnetization according to the embodiment includes an underlayer 11, a reference layer 12, a spin injection layer 13, a memory layer 14, and a protective layer 15 which are sequentially stacked between a lower electrode 16 and an upper electrode 17.

The memory layer 14 is composed of a ferromagnetic material having magnetic moment with the magnetization direction that freely changes in a direction perpendicular to the layer surface. As the memory layer 14, for example, a magnetic material having perpendicular anisotropy, such as a rear earth-transition metal alloy such as TbCoFe, a metal multilayer film such as a Co/Pd multilayer film, or an ordered alloy such as FePt, can be used. In order to decrease the coercive force or decrease the magnetic damping constant, the composition may be controlled, or an additive element may be added.

The reference layer 12 is composed of a ferromagnetic material having magnetic moment with magnetization that is fixed in a direction perpendicular to the film surface. The configuration of the reference layer 12 is described later.

The memory layer 14 and the reference layer 12 are disposed with the spin injection layer 13 provided therebetween. As a material for the spin injection layer 13, a metal film of Cu, Ag, or the like, or an oxide film of $Al_2O_3$, $TiO_2$, MgO, or the like can be used.

Storage of information is performed according to the magnetization direction of the memory layer 14 having uniaxial anisotropy. Writing is performed by applying a current in a direction perpendicular to the film surface and inducing spin torque magnetization reversal. The reference layer 12 serving as a magnetization fixed layer is provided below the memory layer 14 with the magnetization direction that is reversed by spin injection. The reference layer 12 is used as a reference for stored information (magnetization direction) of the memory layer 14.

Since the reference layer 14 is used as a reference of information, the magnetization direction is not changed by storage or reading. However, the magnetization direction is not necessarily fixed in a specified direction, but the magnetization direction may be made more difficult to move than the memory layer 14 by increasing the coercive force, the thickness, or the magnetic damping constant as compared with the memory layer 14.

When magnetization is fixed, the reference layer 12 may be indirectly fixed by contact with an antiferromagnetic material such as PtMn or IrMn or magnetically coupling, through a nonmagnetic material such as Ru, a magnetic material in contact with the antiferromagnetic material.

The protective layer 15 is composed of, for example, at least one element of Li, Be, Na, Mg, Nb, Ti, V, Ta, and Ba, an oxide containing one of these elements, or a nitride of one element of Ti and V.

The underlying layer 11 is composed of, for example, at least one element of Ru, Mg, Ca, V, Nb, Mn, Fe, Co, and Ni, or an oxide containing one of these elements. When the underlying layer 12 is excessively thick, smoothness is decreased, while the underlying layer 12 is excessively thin, it does not function. Therefore, the underlying layer 12 is formed to a thickness of 3 to 30 nm.

Although FIG. 2A shows the case where the reference layer 12 is disposed below the memory layer 14, the reference layer 12 may be disposed above the memory layer 14.

FIG. 2A shows only an example of the layer structure of the magnetic memory element 1 according to an embodiment.

The memory layer 14 of the magnetic memory element 1 including the memory layer 14 with perpendicular magnetization preferably has a cylindrical shape, a truncated cone shape having a slightly narrow upper width, or an elliptic cylinder or truncated elliptic cone having a low aspect ratio.

The shape of the reference layer 12 may be the same as the memory layer 14 but when the reference layer 12 is disposed below the memory layer 14, any desired shape may be used as long as it is larger than the memory layer 14.

In addition, the magnetic memory element 1 is generally surrounded by an insulating layer.

A feature of this embodiment lies in the configuration of the reference layer 12.

FIG. 2B shows Configuration Example I of the reference layer 12.

This is an example having two CoPt layers, in which the reference layer 12 includes a first CoPt layer 21, a Ru (ruthenium) layer 22, a second CoPt layer 23, a Ru layer 24, and a high spin polarization layer 25 which are sequentially stacked from the underlying layer 11 side. The high spin polarization layer 25 is a layer at the interface with the spin injection layer 13.

FIG. 2C shows Configuration Example II of the reference layer 12.

This is an example having two CoPt layers and a buffer layer. The reference layer 12 includes a first CoPt layer 21, a Ru layer 22, a second CoPt layer 23, a buffer layer 26, and a high spin polarization layer 25 which are sequentially stacked from the underlying layer 11 side. The high spin polarization layer 25 is a layer at the interface with the spin injection layer 13.

FIG. 3B shows Configuration Example III of the reference layer 12. FIG. 3A shows the same layer structure of the magnetic memory element 1 as in FIG. 2A.

FIG. 3B shows an example having three CoPt layers. In this case, the reference layer 12 includes a first CoPt layer 21, a Ru layer 22, a second CoPt layer 23, a Ru layer 24, a third CoPt layer 27, a Ru layer 28, and a high spin polarization layer 25 which are sequentially stacked from the underlying layer 11 side. The high spin polarization layer 25 is a layer at the interface with the spin injection layer 13.

FIG. 3C shows Configuration Example IV of the reference layer 12.

FIG. 3C shows an example having three CoPt layers and a buffer layer. In this case, the reference layer 12 includes a first CoPt layer 21, a Ru layer 22, a second CoPt layer 23, a Ru layer 24, a third CoPt layer 27, a buffer layer 26, and a high spin polarization layer 25 which are sequentially stacked from the underlying layer 11 side. The high spin polarization layer 25 is a layer at the interface with the spin injection layer 13.

Similarly, a configuration having four CoPt layers may be used. However, this configuration is not so effective because the film configuration becomes complicated in spite of small improvement in the characteristics.

As described above, when the reference layer 12 is composed of a CoPt alloy having thermally-stable hexagonal crystal or a mixture of the hexagonal crystal and face-centered cubic crystal and having a Pt content of 20 atomic % or more and 50 atomic or less, and the axis of 3-fold symmetry is oriented perpendicularly to the film surface, stable perpendicular magnetic anisotropy can be achieved.

In addition, in order to achieve sufficient coercive force in the reference layer 12, the coercive force is increased by antiferromagnetic coupling between at least two CoPt layers (21, 23, 27) through the Ru layer (22, 24).

In this case, the CoPt alloy layers (21, 23, 27) have a thickness of 1 nm or more and 5 nm or less, and the Ru layer (22, 24) has a thickness of 0.45±0.05 nm or 0.9±0.1 nm, thereby achieving characteristics stable until a high process temperature while maintaining the excellent coercive force increasing effect.

However, when the thickness of the Ru layer (22, 24) between the at least two CoPt layers (21, 23, 27) exceeds the above-described range or when the thickness of the CoPt alloy layers is less than 1 nm or more than 5 nm, the stable coercive force is not obtained in the CoPt alloy layers because of the poor balance between perpendicular magnetic anisotropy and magnetic interaction through the Ru layer.

In particular, when the high spin polarization layer 25 is formed at the interface with the spin injection layer 13 by using a material composted of high-spin-polarization Co and Fe as a main component, the stable reference layer is not realized unless under the above-described conditions.

The reference layer 12 of the magnetic memory element 1 according to the embodiment of the present discloser may further contain less than 10 atomic % of Cr, Fe, Cu, Pd, or Au as an additive element for improving corrosion resistance and controlling the magnetic anisotropy of saturation magnetic flux density.

Further, up to 50% of Pt in the CoPt alloy may be substituted by Ni in order to decrease the material cost.

In addition, as the material for the high-spin polarization layer 25, elemental Fe or Co, a FeCo alloy, or a CoFeB alloy further containing boron can be used. Further, less than 10 atomic % of another element may be added for improving the corrosion resistance, etc.

The buffer layer 26 in each of Configuration Examples II and IV is adapted for decreasing the influence of mutual diffusion between the CoPt layer and the high spin polarization layer 25. The buffer layer 26 functions as at least the reference layer 12, but it is effective for improving the magnetoresistance ratio to use a material composed of at least one of Ti, Cr, V, Nb, Ta, Mo, W, Zr, Hf, Si, Ge, Zn, Mg, Gd, Tb, Dy, Ho, Re, Ru, MgO, $Al_2O_3$, $TiO_2$, and $SiO_2$. However, in order to maintain the magnetic interaction, the thickness of the buffer layer 26 is preferably 0.3 nm or less.

3. Results of Various Investigations

The results of various investigations leading to the configuration of the reference layer 12 according to the embodiment are described below.

3-1: Pt Composition of CoPt Layer

Figure 4:
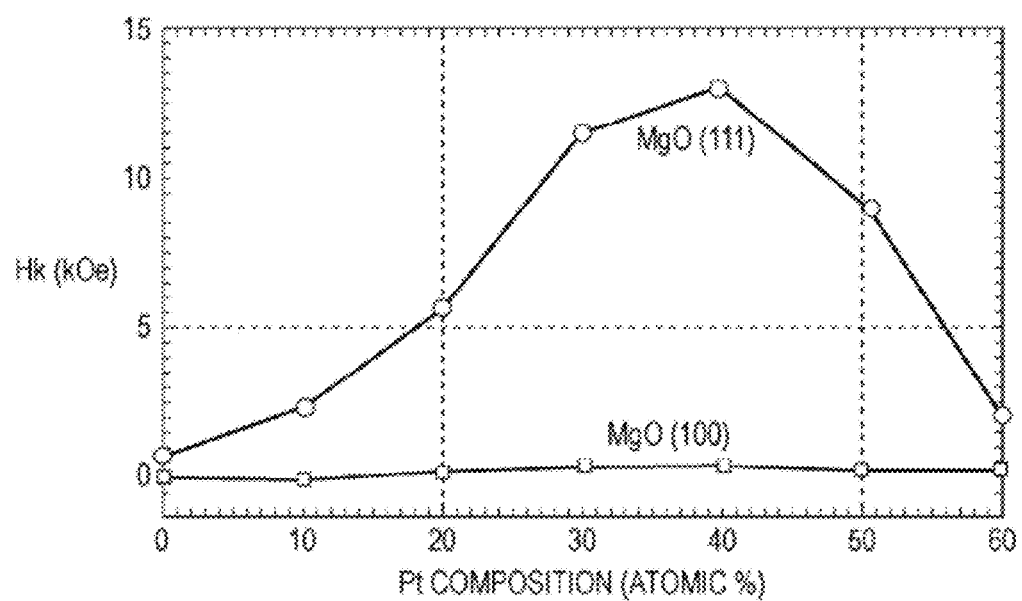
FIG. 4 is a graph illustrating a relation between the perpendicular anisotropic magnetic field and the Pt composition of a CoPt film formed on a MgO single crystal.

FIG. 4 shows a relation between the Pt composition and perpendicular anisotropic magnetic field (Hk) of a CoPt alloy film having a thickness of 10 nm and formed on each of a (100) plane and (111) plane of single crystal MgO. The perpendicular anisotropic magnetic field is shown by the magnetic field applied in the film in-plane direction of a sample to saturate magnetization.

This figure indicates that substantially no perpendicular magnetic anisotropy is observed in the CoPt alloy film formed on the MgO (100) plane. On the other hand, perpendicular magnetic anisotropy is observed in the CoPt alloy film formed on the MgO (111) plane. In particular, large perpendicular magnetic anisotropy (for example, 5 kOe or more) is observed at a Pt composition of 20 to 50 atomic %. The perpendicular magnetic anisotropy is particularly large at a Pt composition of 30 to 40 atomic %, which is preferred in use for the reference layer 12. However, in view of the condition of 5 kOe or more, the Pt composition is properly in the range of 20 to 50 atomic %.

Figure 5A:
FIGS. 5A and 5B are photographs showing an electron beam lattice image and a diffraction image of CoPt deposited on a MgO (111) plane.
Figure 5B:
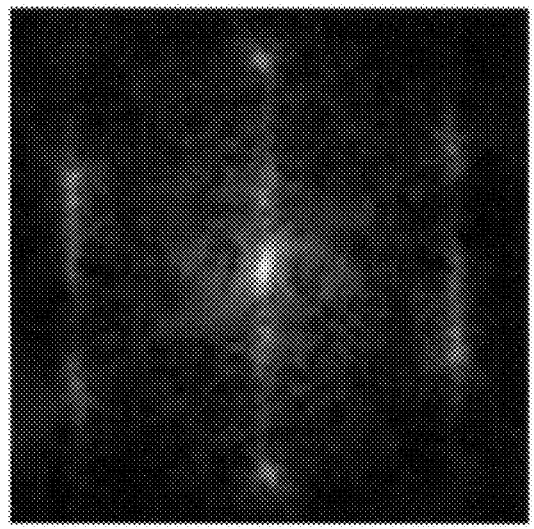

FIGS. 5A and 5B show a lattice image and a diffraction image of a $Co_{80}Pt_{20}$ film formed on single crystal MgO (111) observed with an electron microscope.

The crystal structure is composed of a close-packed hexagonal lattice containing stacking fault which corresponds to an intermediate state between a close-packed hexagonal lattice and a face-centered cubic lattice, and has 3-fold crystal symmetry with respect to a direction perpendicular to the film surface.

The method for orienting the axis of 3-fold crystal symmetry of a CoPt alloy film may include deposition on the axial plane of 3-fold symmetry of a single crystal, such as MgO (111). However, a more convenient method may include deposition on a base material of Ru or Re, which has a close-packed hexagonal structure, or Cu, Au, or Pt, which has a face-centered cubic structure.

In particular, Ru is suitable for the underlayer 11 because a thin film can be easily formed and easily oriented.

3-2: Effect of Ni Addition to CoPt Alloy

Next, the effect of Ni addition to a CoPt alloy was examined.

Figure 6:
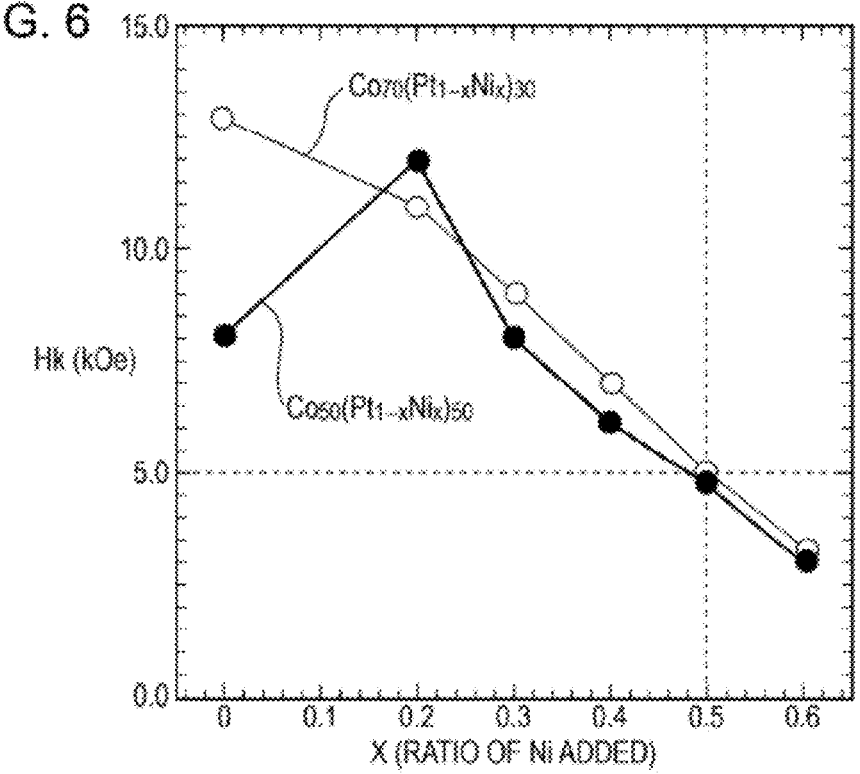
FIG. 6 is a graph showing changes in perpendicular anisotropic magnetic field with substitution by Ni for Pt of CoPt.

FIG. 6 shows changes in perpendicular magnetic anisotropy (Hk) with the Pt/Ni ratio of a CoNiPt film having a thickness of 10 nm and formed on a Ru film having a thickness of 5 nm.

In this figure, "X" represents the ratio of Ni added and shown on the abscissa. The figure shows the perpendicular magnetic anisotropy (Hk) of each of the samples of a $Co_{70}Pt_{30}$ film and a $Co_{50}Pt_{50}$ film each substituted by Ni for Pt at a ratio "X".

The perpendicular magnetic anisotropy (Hk) tends to be gradually decreased by substituting Pt by Ni, but a perpendicular magnetic anisotropy of 5 kOe or more can be obtained by substitution up to about 50%.

Therefore, it is found that the CoPt alloy of the CoPt layers (21, 23, 27) may be substituted by Ni for up to 50% of Pt. This is particularly effect in decreasing the material cost.

3-3: Structure Including at Least 2 CoPt Layers Stacked Through Ru Layer

Figure 7:
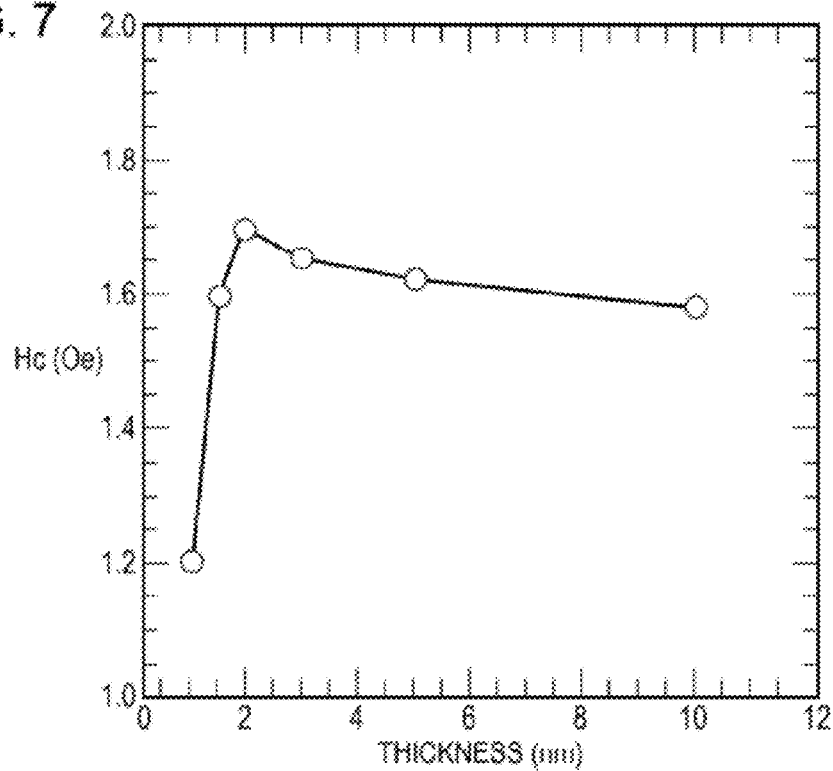
FIG. 7 is a graph showing a relation between the thickness and coercive force of a CoPt layer.

FIG. 7 shows changes in coercive force in accordance with the thickness of a $Co_{70}Pt_{30}$ film formed on a Ru base having a thickness of 5 nm.

FIG. 7 indicates that the coercive force is little increased by increasing the thickness of $Co_{70}Pt_{30}$ to 2 nm or more, and thus such a $Co_{70}Pt_{30}$ film is unsuitable for the reference layer 12.

Figures 8A, 8B:
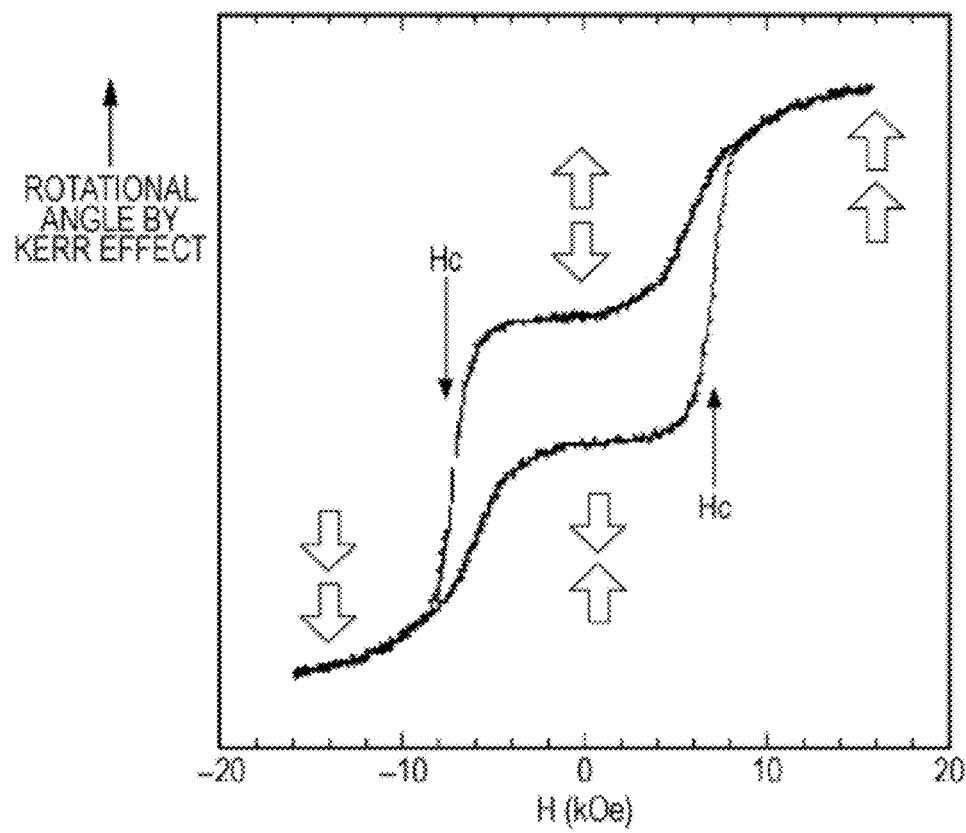
FIGS. 8A and 8B are diagrams showing the results of measurement by the magneto-optical Kerr effect of two CoPt films magnetically coupled through Ru.

FIG. 8A shows the results of measurement of magnetization, by the magneto-optical effect, of two $Co_{70}Pt_{30}$ layers having a thickness of 3 nm and stacked with a Ru layer having a thickness of 0.9 nm provided therebetween on a Ru underlayer having a thickness of 5 nm or more as shown in FIG. 8B.

The structure shown in FIG. 8B corresponds to the configuration example including the underlying layer 11, the first CoPt layer 21, the Ru layer 22, and the second CoPt layer 23 in the configuration examples shown in FIGS. 2A to 2C and 3A to 3C.

In FIG. 8A, the rotational angle by the magnetic Kerr effect is shown on the ordinate and corresponds to the amount of magnetization. In the figure, the magnetization directions of the upper CoPt layer and the lower CoPt layer are shown by arrows.

In this state, the magnetization state is not changed until the magnetic field shown by Hc in FIG. 8A, and the stacked structure sufficiently stably functions as the reference layer 12 of the magnetic memory element 1.

That is, it is found that the structure including at least two CoPt layers stacked with a Ru layer provided therebetween is effective as the reference layer 12.

In addition, the magnetic film used in the embodiment does not cause simple changes in magnetization in response to a simple magnetic field. Therefore, when the magnetization configuration is irreversibly changed by increasing the magnetic field and is not returned to the initial state, the magnetic field is defined as the coercive force Hc.

3-4: Thickness of Ru Layer

Next, the thickness of a Ru layer in a structure including at least two CoPt layers stacked with the Ru layer therebetween was examined.

Figure 9A:
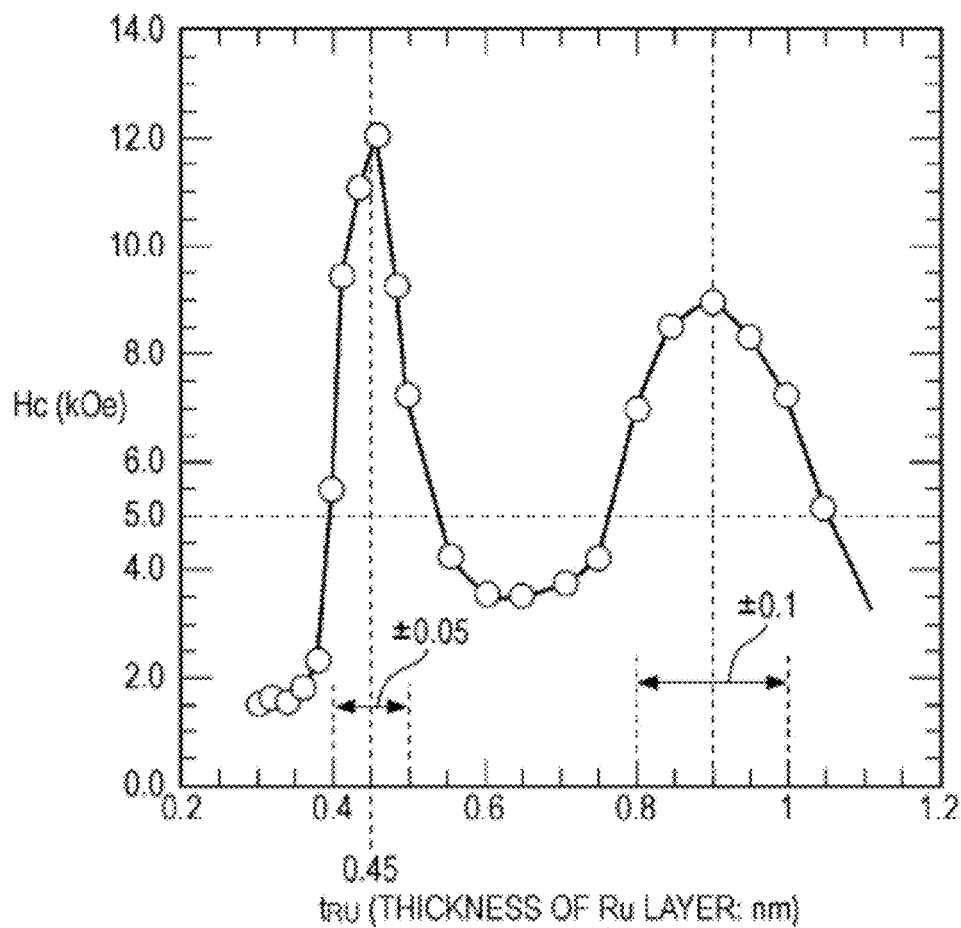
FIGS. 9A and 9B are diagrams showing changes in coercive force with the thickness of a Ru film in CoPt/Ru/CoPt films.
Figure 9B:
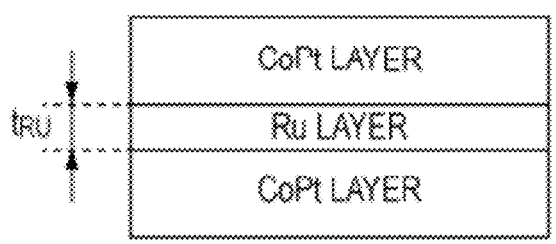

FIG. 9A shows changes in coercive force Hc with changes in the thickness of the Ru layer provided between two CoPt layers as shown in FIG. 9B.

In FIG. 9A, the coercive force Hc is shown on the ordinate, and the thickness $t_{Ru}$ of the Ru layer is shown on the abscissa.

FIG. 9A shows two peaks at the Ru layer thickness of 0.45 nm and 0.9 nm. Therefore, the thickness range for achieving a sufficient coercive force of 5 kOe or more is 0.45 nm±0.05 nm or 0.9 nm±0.1 nm.

That is, in a configuration corresponding to Configuration Examples I to IV shown in FIGS. 2A to 2C and 3A to 3C each including the first CoPt layer 21, the Ru layer 22, and the second CoPt layer 23 or Configuration Examples III and IV shown in FIGS. 3A to 3C each including the second CoPt layer 23, the Ru layer 24, and the third CoPt layer 27, the proper thickness of the Ru layer is 0.45 nm±0.05 nm or 0.9 nm±0.1 nm.

3-5: Thickness of CoPt Layer

Next, the thickness of a CoPt layer in a structure including at least two CoPt layers stacked with a Ru layer therebetween was examined.

Figure 10A:
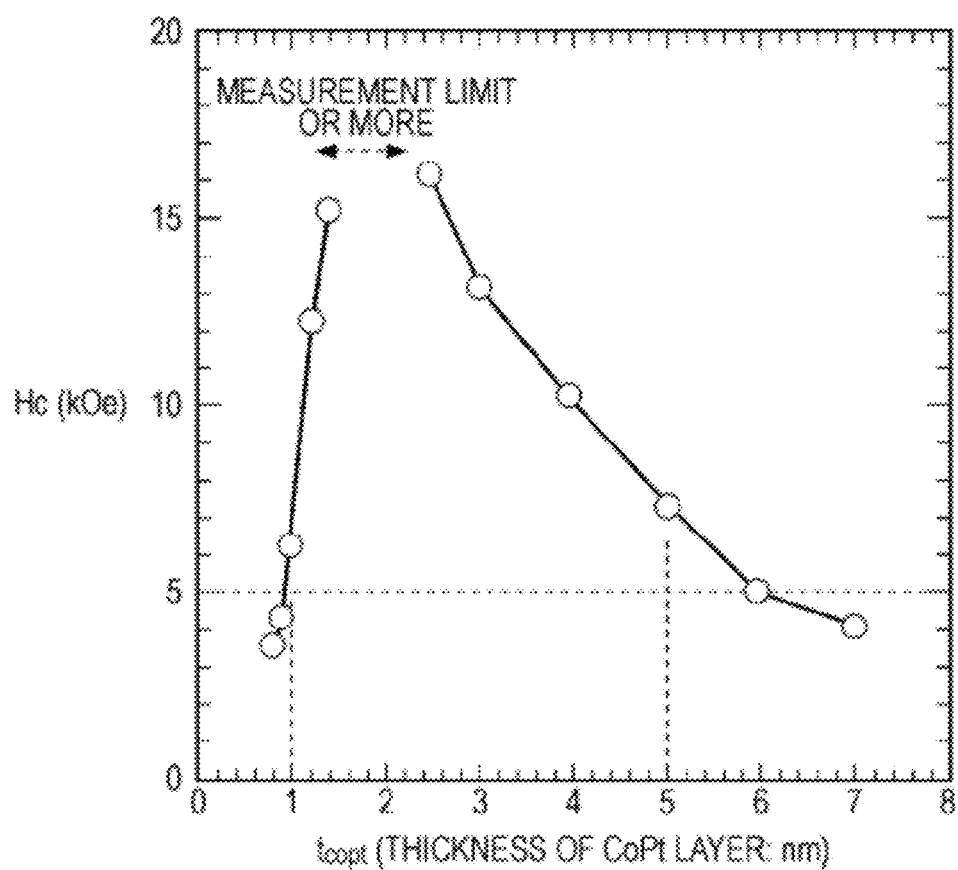
FIGS. 10A and 10B are diagrams showing changes in coercive force with the CoPt film thickness of CoPt/Ru/CoPt films.
Figure 10B:
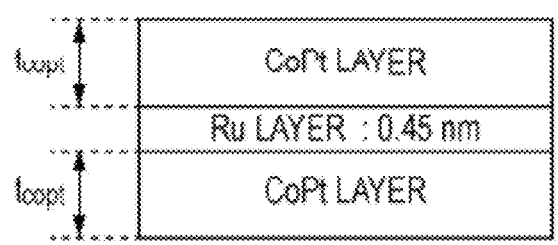

FIG. 10A shows changes in coercive force Hc with changes in the thickness $t_{copt}$ of a CoPt layer ($Co_{70}Pt_{30}$) layer in a structure including two CoPt layers stacked with a Ru layer therebetween, while the thickness of the Ru layer is fixed at 0.45 nm, as shown in FIG. 10B.

In FIG. 10A, the coercive force Hc is shown on the ordinate, and the thickness tcopt of the CoPt layer is shown on the abscissa.

When the thickness of the CoPt alloy is 1 nm or more and 5 nm or less, a large coercive force of 5 kOe or more can be obtained. In particular, a coercive force of 17 kOe or more at a measurement limit is obtained near the thickness of 2 nm.

This result reveals that in Configuration Examples I to IV shown in FIGS. 2A to 2C and 3A to 3C, the proper thickness for the first CoPt layer 21, the second CoPt layer 23, and the third CoPt layer 27 is 1 nm or more and 5 nm or less.

3-6: Thickness of High Spin Polarization Layer

When information is read out from the magnetic memory element 1 by using the tunnel magnetoresistance effect, the magnetoresistance ratio (MR ratio) is preferably as high as possible. A preferred method for improving the MR ratio uses a Fe—Co alloy having high spin polarizability at the interface between the spin injection layer 13 and the reference layer 12. In particular, when the spin injection layer 13 is composed of MgO, it is suitable to use a CoFeB alloy for the high spin polarization layer 25.

However, a material with high spin polarizability has weak perpendicular magnetic anisotropy or in-plane magnetic anisotropy.

In the magnetic memory element 1 according to the embodiment, a high spin polarization material is used for the high-spin polarization layer 25 and magnetized perpendicularly by magnetic coupling with the perpendicular magnetic film in the reference layer 12.

FIG. 11A shows magneto-optical Kerr curves with changes in thickness of a CoFeB layer used for the high spin polarization layer 25.

In this case, as shown in FIG. 11B, a Ta layer having a thickness of 5 nm and a Ru layer having a thickness of 5 nm are provided as the underlayer 11. The spin injection layer 13 is composed of MgO of 1 nm in thickness, and the reference layer 12 has a structure corresponding to Configuration Example I shown in FIG. 2B.

That is, a $Co_{70}Pt_{30}$ layer (first CoPt layer 21) having a thickness of 2 nm, the Ru layer 22 having a thickness of 0.45 nm, a $Co_{70}Pt_{30}$ layer (second CoPt layer 23) having a thickness of 4 nm, the Ru layer 24 having a thickness of 0.9 nm, and a $Co_{50}Fe_{30}B_{20}$ layer as the high spin polarization layer 25 having a thickness of "t" nm are provided.

The thickness t of the $Co_{50}Fe_{30}B_{20}$ layer is changed to 2 nm, 1.5 nm, 1 nm, and 0.5 nm.

In the magneto-optical Kerr curves with the thicknesses shown in FIG. 11A, a parallel region is a region where magnetization of the CoFeB film is maintained perpendicular.

In FIG. 11A, magnetization of the CoFeB film is not maintained perpendicular at the magnetic field of Hf or more. Therefore, it is necessary that Hf is higher than zero magnetic field and sufficiently high. This result reveals that the thickness of the high spin polarization layer 25 is preferably 1.5 nm or less. The thickness of the high spin polarization layer 25 may be 0.5 nm or less, but magnetization disappears with the thickness smaller than this value. Therefore, the proper thickness of the CoFeB layer is limited so that magnetization does not disappear, and is actually preferably within the range of 0.5 nm to 1.5 nm.

3-7: Buffer Layer

In Configuration Examples II and IV shown in FIGS. 2C and 3C, the buffer layer 26 is provided. Here, the material of the buffer layer 26 is described.

Here, a Ta layer having a thickness of 5 nm, a Ru layer having a thickness of 5 nm, a $Co_{70}Pt_{30}$ layer having a thickness of 4 nm, a Ru layer having a thickness of 0.45 nm, a $Co_{70}Pt_{30}$ layer having a thickness of 2 nm, a buffer layer, a $Co_{50}Fe_{30}B_{20}$ layer having a thickness of 1 nm, a MgO layer having a thickness of 1.5 nm, and a $Co_{50}Fe_{30}B_{20}$ layer having a thickness of 2 nm were deposited.

After these layers were deposited, the layers were heat-treated at 400° C., and a TbFeCo film of 10 nm was deposited thereon in order to make magnetization of CoFeB perpendicular, to measure tunnel magnetoresistance.

FIG. 12 shows the MR ratio of a sample of each of various buffer layer materials with thicknesses.

When the MR ratio of 20% without the buffer layer is considered as a reference, the materials and thicknesses described in shadowed portions are unsuitable for the buffer layer.

As shown in FIG. 12, materials having a face-centered cubic structure are poor, and the other materials have effect.

When the thickness exceeds 0.3 nm, magnetic interaction is weakened, and thus the high spin polarization layer 25 does not maintain perpendicular magnetization.

3-8: Thickness Ratios of Various CoPt Layers

Next, investigation was made by changing the thickness ratio of a CoPt layer.

FIGS. 13A to 13C shows Samples 1 and 2 each including two CoPt layers corresponding to Configuration Examples I and II shown in FIGS. 2B and 2C.

FIG. 13B shows a layer structure of Sample 1.

Sample 1 includes a Ta layer having a thickness of 5 nm and a Ru layer having a thickness of 5 nm which constitute an underlayer 11.

In addition, the spin injection layer 13 includes MgO having a thickness of 1 nm.

The reference layer 12 includes a $Co_{70}Pt_{30}$ layer (first CoPt layer 21) having a thickness of "t1" nm, a Ru layer 22 having a thickness of 0.45 nm, a $Co_{70}Pt_{30}$ layer (second CoPt layer 23) having a thickness of "t2" nm, a Ru layer 24 having a thickness of 0.9 nm, and a $Co_{50}Fe_{30}B_{20}$ layer (high spin polarization layer 25) having a thickness of 1 nm, which are stacked in order.

FIG. 13C shows a layer structure of Sample 2.

Sample 2 includes a Ta layer having a thickness of 5 nm and a Ru layer having a thickness of 5 nm which constitute an underlayer 11.

In addition, the spin injection layer 13 includes a MgO layer having a thickness of 1 nm.

The reference layer 12 includes a $Co_{70}Pt_{30}$ layer (first CoPt layer 21) having a thickness of "t1" nm, a Ru layer 22 having a thickness of 0.45 nm, a $Co_{70}Pt_{30}$ layer (second CoPt layer 23) having a thickness of "t2" nm, a Ta layer (buffer layer 26) having a thickness of 0.2 nm, and a $Co_{50}Fe_{30}B_{20}$ layer (high spin polarization layer 25) having a thickness of 1 nm, which are stacked in order.

FIG. 13A shows changes in the coercive force with the difference between the thickness t1 of the first CoPt layer 21 and the thickness t2 of the second CoPt layer 23 in each of Samples 1 and 2. The coercive force is shown on the ordinate, and the value (t1−t2) is shown on the abscissa.

In Sample 1, the thickness t1 of the first CoPt layer 21 is fixed, while in Sample 2, the thickness t2 of the second CoPt layer 23 is fixed.

That is, with respect to Sample 1, changes in coercive force with changes in thickness of the second CoPt layer 23 are shown in the case of the first CoPt layer 21 having a thickness t1 of each of 2 nm and 3 nm.

In addition, with respect to Sample 2, changes in coercive force with changes in thickness of the first CoPt layer 21 are shown in the case of the second CoPt layer 23 having a thickness t2 of each of 2 nm, 3 nm, and 4 nm.

These figures indicate that in Sample 1, the coercive force Hc is maximized within the range of −1 to −2 on the abscissa, i.e., when the thickness t2 is larger than the thickness t1 by 1 to 2 nm.

Namely, this is the case where the thickness of the second CoPt layer 23 is larger than the thickness of the first CoPt layer 21 by 1 nm or more and 2 nm or less.

In Sample 2, the coercive force Hc is maximized within the range of 1 to 2 on the abscissa, i.e., when the thickness t1 is larger than the thickness t2 by 1 to 2 nm. Namely, this is the case where the thickness of the first CoPt layer 21 is larger than the thickness of the second CoPt layer 23 by 1 nm or more and 2 nm or less.

Figures 14A, 14B, 14C:
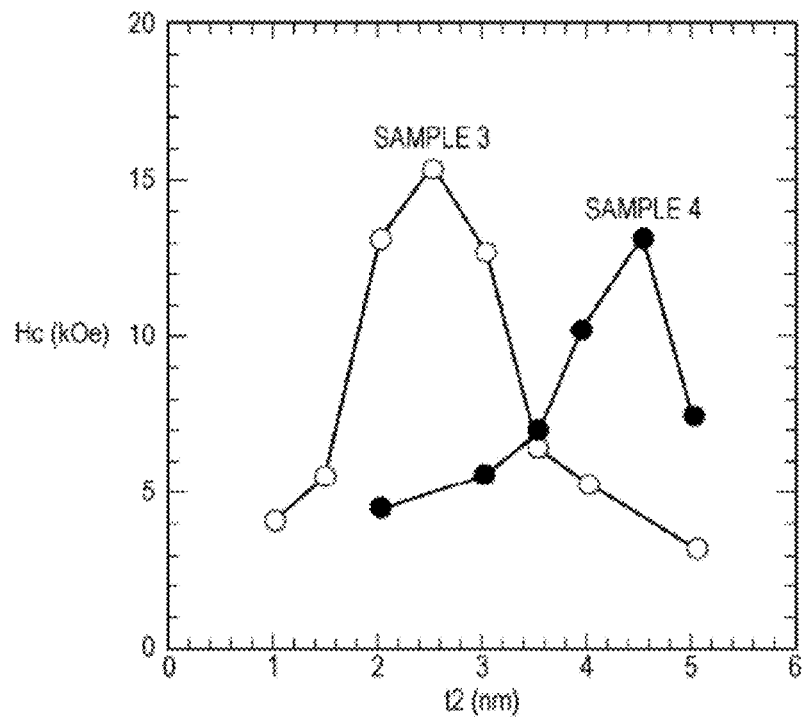
FIGS. 14A, 14B, and 14C are diagrams showing changes in coercive force with changes in thickness of a third CoPt layer each of Samples 3 and 4 according to an embodiment.

FIGS. 14A to 14C show Samples 3 and 4 as an example including three CoPt layers corresponding to Configuration Examples III and IV shown in FIGS. 3B and 3C.

FIG. 14B shows a layer structure of Sample 3.

Sample 3 includes a Ta layer having a thickness of 5 nm and a Ru layer having a thickness of 5 nm, which constitute an underlayer 11.

In addition, the spin injection layer 13 includes a MgO layer having a thickness of 1 nm.

The reference layer 12 includes a $Co_{70}Pt_{30}$ layer (first CoPt layer 21) having a thickness of 2 nm, a Ru layer 22 having a thickness of 0.45 nm, a $Co_{70}Pt_{30}$ layer (second CoPt layer 23) having a thickness of "t2" nm, a Ru layer 24 having a thickness of 0.45 nm, a $Co_{70}Pt_{30}$ layer (third CoPt layer 27) having a thickness of 2 nm, a Ru layer 28 having a thickness of 0.9 nm, and a $Co_{50}Fe_{30}B_{20}$ layer (high spin polarization layer 25) having a thickness of 1 nm, which are stacked in order.

FIG. 14C shows a layer structure of Sample 4.

Sample 4 includes a Ta layer having a thickness of 5 nm and a Ru layer having a thickness of 5 nm, which constitute an underlayer 11.

In addition, the spin injection layer 13 includes a MgO layer having a thickness of 1 nm.

The reference layer 12 includes a $Co_{70}Pt_{30}$ layer (first CoPt layer 21) having a thickness of 2 nm, a Ru layer 22 having a thickness of 0.45 nm, a $Co_{70}Pt_{30}$ layer (second CoPt layer 23) having a thickness of "t2" nm, a Ru layer 24 having a thickness of 0.45 nm, a $Co_{70}Pt_{30}$ layer (third CoPt layer 27) having a thickness of 1 nm, a Ta layer (buffer layer 26) having a thickness of 0.2 nm, and a $Co_{50}Fe_{30}B_{20}$ layer (high spin polarization layer 25) having a thickness of 1 nm, which are stacked in order.

FIG. 14A shows the dependence of coercive force on the thickness t2 of the second CoPt layer 23 in each of Samples 3 and 4. The coercive force is shown on the ordinate, and the value of t2 is shown on the abscissa. With respect to both Samples 3 and 4, changes in the coercive force with changes in thickness of the second CoPt layer 23 are shown.

In Sample 3, the coercive force is increased at the thickness t2 of 2 nm to 3 nm. Namely, in Sample 3, the sufficient coercive force is obtained when the total thickness of the first CoPt layer 21 and the third CoPt layer 27 is larger than the thickness of the second CoPt layer 23 by 1 nm to 2 nm.

In Sample 4, the coercive force is increased at the thickness t2 of 4 nm to 5 nm. Namely, in Sample 4, the sufficient coercive force is obtained when the thickness of the second CoPt layer 23 is larger than the total thickness of the first CoPt layer 21 and the third CoPt layer 27 by 1 nm to 2 nm.

3-9: Summary

The above-described results of investigations indicate the following matters.

It is desirable that the reference layer 12 includes a CoPt layer having a Pt content of 20 atomic % or more and 50 atomic % or less, and the axis of 3-fold crystal symmetry of the CoPt layer is oriented perpendicularly to the film surface.

A proper structure includes at least two CoPt layers which have a thickness of 1 nm or more and 5 nm or less and are stacked with a Ru layer provided therebetween.

It is also desirable that the thickness of Ru layer sandwiched between the CoPt layers is 0.45±0.05 nm or 0.9±0.1 nm.

It is also desirable that the interface between the reference layer 12 and the spin injection layer 13 includes the high spin polarization layer 25 of 1.5 nm or less composed of Co or Fe as a main component.

That is, when the reference layer 12 has a structure corresponding to Configuration Examples I to IV of the reference layer shown in FIGS. 2A to 2C and 3A to 3C, and satisfies the above-described conditions, the reference layer 12 for a perpendicular magnetic memory, which is capable of producing stable coercive force even with a small thickness, can be realized. In addition, by using the reference layer 12, the magnetic memory element 11 being little susceptible to the influences of a temperature change and an external magnetic field and capable of stable operation can be realized.

Further, in Configuration Example I of the reference layer, when the thickness of the second CoPt layer 23 is larger than the thickness of the first CoPt layer 21 by 1 nm or more 2 nm or less, the sufficient coercive force is obtained.

In Configuration Example II of the reference layer, when the thickness of the first CoPt layer 21 is larger than the thickness of the second CoPt layer 23 by 1 nm or more 2 nm or less, the sufficient coercive force is obtained.

In Configuration Example III of the reference layer, when the total thickness of the first CoPt layer 21 and the third CoPt layer 27 is larger than the thickness of the second CoPt layer 23 by 1 nm or more 2 nm or less, the sufficient coercive force is obtained.

In Configuration Example IV of the reference layer, when the thickness of the second CoPt layer 23 is larger than the total thickness of the first CoPt layer 21 and the third CoPt layer 27 by 1 nm or more 2 nm or less, the sufficient coercive force is obtained.

Although the embodiment is described above, the shape of the magnetic memory element 1, the thickness of each of the layers, the film materials, etc. according to the embodiment are not limited to the above-described examples, and various examples can be conceived.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A magnetic memory element comprising:
a memory layer having magnetization perpendicular to a film surface and being changed in magnetization direction in response to information;
a reference layer having magnetization perpendicular to the film surface and serving as a reference for information; and
a spin-injection layer composed of a nonmagnetic material and provided between the memory layer and the reference layer,
wherein when a current is passed through a layer structure including the memory layer, the spin-injection layer, and the reference layer, spin torque is produced so that information is stored in the memory layer by magnetization reversal induced by the spin torque;
the reference layer has a structure in which at least two CoPt layers containing 20 atomic % or more and 50 atomic % or less of Pt and having a thickness of 1 nm or more and 5 nm or less are stacked with a Ru layer provided therebetween;
the thickness of the Ru layer is 0.45±0.05 nm or 0.9±0.1 nm;
the axis of 3-fold crystal symmetry of the CoPt layers is oriented perpendicularly to the film surface; and
the reference layer includes a high spin polarization layer of 1.5 nm or less in thickness containing Co or Fe as a main component at an interface with the spin-injection layer.

2. The magnetic memory element according to claim 1, wherein the high spin polarization layer in the reference layer is a CoFeB layer.

3. The magnetic memory element according to claim 1, wherein the CoPt layers in the reference layer are each substituted by Ni for less than 50% of Pt.

4. The magnetic memory element according to claim 1, wherein the reference layer is configured by sequentially stacking a first CoPt layer, a Ru layer, a second CoPt layer, a Ru layer, and a high spin polarization layer; and
the thickness of the second CoPt layer is larger than the thickness of the first CoPt layer by 1 nm or more and 2 nm or less.

5. The magnetic memory element according to claim 1, wherein the reference layer is configured by sequentially stacking a first CoPt layer, a Ru layer, a second CoPt layer, a buffer layer, and a high spin polarization layer;
the buffer layer has a thickness of 0.3 nm or less and is composed of at least one of Ti, Cr, V, Nb, Ta, Mo, W, Zr, Hf, Si, Ge, Zn, Mg, Gd, Tb, Dy, Ho, Re, Ru, MgO, $Al_2O_3$, $TiO_2$, and $SiO_2$; and
the thickness of the first CoPt layer is larger by 1 nm or more and 2 nm or less than the thickness of the second CoPt layer.

6. The magnetic memory element according to claim 1, wherein the reference layer is configured by sequentially stacking a first CoPt layer, a Ru layer, a second CoPt layer, a Ru layer, a third CoPt layer, a Ru layer, and a high spin polarization layer; and the total thickness of the first CoPt layer and the third CoPt layer is larger than the thickness of the second CoPt layer by 1 nm or more and 2 nm or less.

7. The magnetic memory element according to claim 1, wherein the reference layer is configured by sequentially stacking a first CoPt layer, a Ru layer, a second CoPt layer, a Ru layer, a third CoPt layer, a buffer layer, and a high spin polarization layer;

the buffer layer has a thickness of 0.3 nm or less and is composed of at least one of Ti, Cr, V, Nb, Ta, Mo, W, Zr, Hf, Si, Ge, Zn, Mg, Gd, Tb, Dy, Ho, Re, Ru, MgO, $Al_2O_3$, $TiO_2$, and $SiO_2$; and the thickness of the second CoPt layer is larger by 1 nm or more and 2 nm or less than the total thickness of the first CoPt layer and the third CoPt layer.

* * * * *